United States Patent [19]

Zakhariya

[11] 4,387,388
[45] Jun. 7, 1983

[54] PACKAGE AND CONNECTOR RECEPTACLE

[75] Inventor: Ramiz H. Zakhariya, San Diego, Calif.

[73] Assignee: NCR Corporation, Dayton, Ohio

[21] Appl. No.: 167,855

[22] Filed: Jul. 14, 1980

[51] Int. Cl.³ .......................................... H01L 23/50
[52] U.S. Cl. ................. 357/74; 339/17 CF;
 357/68; 357/80
[58] Field of Search .......... 339/17 CF, 179;
 174/52 S, 52 FP; 357/70, 71, 75, 80, 74, 68;
 361/412, 421

[56] References Cited

U.S. PATENT DOCUMENTS

| | | | |
|---|---|---|---|
| 3,160,455 | 12/1964 | Mason et al. | 339/17 |
| 3,676,748 | 7/1972 | Kobayashi et al. | 361/421 |
| 4,018,494 | 4/1977 | Scheingold | 339/17 CF |
| 4,130,327 | 12/1978 | Spaulding | 339/17 CF |
| 4,296,456 | 10/1981 | Reid | 174/52 S X |

Primary Examiner—Eugene F. Desmond
Attorney, Agent, or Firm—J. T. Cavender; Edward Dugas; Stephen F. Jewett

[57] ABSTRACT

A connector assembly for connection to a computer backpanel or the like includes a leadless integrated circuit package and a connector receptacle for receiving the leadless package. The leadless package has two insulating layers and outwardly extending conductors formed on each of the two layers. The insulating layers have contact coupling edges, with the contact coupling edge of one layer extending outwardly of the contact coupling edge of the other layer. Rows of contacts in the receptacle make electrical contact with the conductors on the leadless package at the contact coupling edges. In a second embodiment, the connector assembly includes a leadless integrated circuit package having three insulating layers and outwardly extending conductors formed on each of the three layers.

9 Claims, 5 Drawing Figures

PACKAGE AND CONNECTOR RECEPTACLE

BACKGROUND OF THE INVENTION

The present invention relates to circuit packages and, more particularly, to leadless integrated circuit packages for supporting integrated circuit chips and connector receptacles for receiving such packages.

Leadless integrated circuit packages are commonly used for mounting integrated circuits on printed circuit boards, computer backpanels, and the like, and have significant advantages over conventional dual in-line packages (DIP's) and single in-line packages (SIP's) in the manufacture of large electronic systems, such as computers. If, during the assembly of integrated circuits on a computer backpanel, there is discovered a defect in one of the integrated circuits, the leadless package having the defective integrated circuit is simply removed from its receptacle and replaced with a new package. There is thereby eliminated the problem of removing packages having soldered leads or pins, and the potential for bending or breaking such pins when removed.

As is the case with any integrated circuit package, whether leadless or not, there is a practical limitation on the number of external connections that can be made to the package and chip, such limitation largely depending on the physical dimensions of the package. A leadless package typically has an insulating substrate or layer and a plurality or set of conductors on the layer extending between connector coupling edges about the periphery of the layer and a center or central location of the package where the integrated circuit chip is supported. These conductors provide electrical connections to the chip, but must be limited in number since each conductor requires a certain amount of surface area on the layer.

Advances in integrated circuit technology have resulted in increased circuit densities and, in turn, increased numbers of circuit functions that can be provided on a single integrated circuit chip. However, such increases in the number of functions often require additional external electrical connections to the chip. In the past, the only apparent way in which the number of external connections could be increased was generally to increase the size or surface area of the package so that more conductors would be provided between the connector coupling edges of the insulating layer and the integrated circuit layer. Increasing the size of the package, however, also increases the amount of area required for each package on a circuit board or backpanel, and thus eliminates some of the space savings achieved by the increased circuit density of the chip itself.

SUMMARY OF THE INVENTION

There is provided, in accordance with the present invention, a leadless integrated circuit package that, in comparison to prior packages, has an increased number of external electrical connections to an integrated circuit chip supported in the package, without a significant increase in the surface area of the package.

More particularly, there is provided, in accordance with the present invention, a leadless package for mounting an integrated circuit chip, the leadless package having a first plurality of substantially coplanar conductors electrically connected to and projecting outwardly from the chip. A second plurality of coplanar conductors are also electrically connected to and project outwardly from the chip. The second plurality of conductors each lie in a plane spaced from the plane of the first plurality of conductors in a direction that is substantially transverse to the direction in which the conductors extend outwardly from the chip.

The first plurality of conductors are formed on a first insulating layer and the second plurality of conductors are formed on a second insulating layer. The first layer overlies the second layer and has a contact coupling edge that overhangs or is spaced outwardly from an adjacent contact coupling edge of the second layer.

An electrical connector receptacle is provided for receiving the package, the receptacle having rows of contacts spaced to make electrical contact with the conductors on the contact coupling edges of the two layers of the package. Each contact in the receptacle couples with one conductor at the contact coupling edge of one of the layers.

In one described embodiment, the two insulating layers include a first, upper layer and a second, lower layer. The upper layer has four contact coupling edges projecting or spaced outwardly of four contact coupling edges of the lower layer. Conductors on each of the upper and lower layers extend between the contact coupling edges and the integrated circuit chip at a center open portion of the package. The connector receptacle for receiving the package includes an outer row of contacts and an inner row of contacts along upper and lower edges, respectively, of four side walls within the receptacle. The contacts in the outer rows electrically contact the conductors at the contact coupling edges of the upper layer of the package, and the contacts in the inner rows electrically contact conductors at the contact coupling edge of the lower layer of the package.

It is, therefore, an object of the present invention to provide an improved circuit package.

It is another object of the present invention to provide an integrated circuit package that requires a minimum amount of surface area when electrically connected at a printed circuit board or computer backpanel.

It is another object of the present invention to provide an improved leadless integrated circuit package having a large number of conductors for providing external electrical connections to an integrated circuit chip supported in the package.

It is still another object of the present invention to provide a leadless integrated circuit package and to provide an electrical connector receptacle for receiving the package, where a large number of electrical connections are made to the integrated circuit chip supported in the package.

These and other objects of the present invention will become more apparent when taken in conjunction with the following description and the attached drawings.

DETAIL DESCRIPTION OF THE PREFERRED EMBODIMENTS

Figure 1:
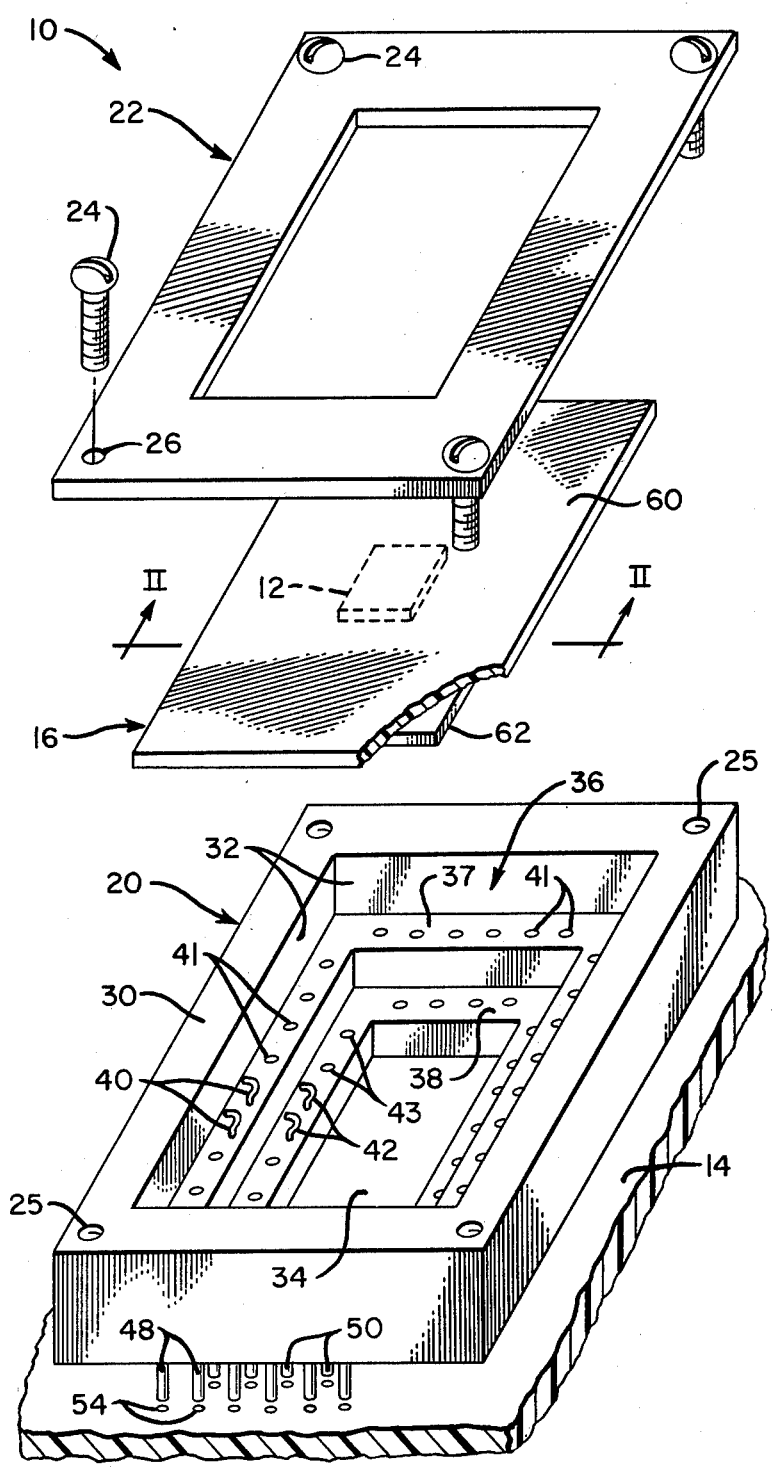
FIG. 1 is an exploded perspective view, with portions broken away, of a connector assembly in accordance with the present invention, the connector assembly shown positioned for being electrically connected to a computer backpanel.

Turning now to the drawings, there is shown in FIG. 1 a connector assembly 10 for electrically connecting an integrated circuit chip 12 to a computer backpanel 14. The integrated circuit chip 12 is supported or mounted, as shown in phantom in FIG. 1, on the underside of a leadless integrated circuit package 16. The package 16 can be removably inserted into a connected receptacle 20 and is held in place in the receptacle 20 by a cover plate 22. The cover plate 22 is secured to the receptacle 20 by conventional means, such as the illustrated screws 24 that pass through holes 26 in the cover plates 22 and are threadedly received in aligned holes 25 at the four corners of a housing 30 of the receptacle 20. Alternatively, but not shown in the drawings, the cover plate 26 could, as conventional, be hinged to the housing 30 along one side thereof, and have a latch or clip for releasably securing the cover plate 26 to the opposite side of the housing. The actual manner in which the cover plate 26 is secured to the housing 20 is unimportant for purposes of the present invention.

As seen in FIG. 1, the housing 30 of the receptacle 20 has four side walls 32 and a bottom wall 34 that define an upwardly and outwardly opening chamber 36 into which the leadless package 16 is placed. The side walls 32 include, within the housing 30 and around the chamber 36, an upper ledge 37 and a lower ledge 38. An outer row of resilient electrical contacts 40 (only two of which are shown in FIG. 1) extend through apertures 41 into the chamber 36 at the upper ledge 37 along each of the side walls 32. Similarly, an inner row of resilient electrical contacts 42 (only two of which are shown in FIG. 1) extend through apertures 43 into the chamber 36 at the lower ledge 38 along each of the side walls 32.

As can be seen in the drawings, the contacts 40 are spaced both upwardly and outwardly from the contacts 42. The contacts 40 are electrically connected to outer rows of pins 48 projecting downwardly from the bottom of housing 30, and the contacts 42 are electrically connected to inner rows of pins 50, spaced inwardly from the outer rows of pins 48 and also projecting downwardly from the bottom of the housing 30. The pins 48 and 50 are received in apertures 54 in the backpanel 14 for making electrical connections with circuits or conductors (not shown) at the backpanel.

As will be described in greater detail later, when the connector assembly 10 is fully assembled, the leadless package 16 is held firmly between the cover plate 22 and the rows of contacts 40 and 42 in the housing chamber 36. Each of the contacts 40 and 42 will provide an electrical connection between one of the pins 48 and 50 and the leadless package 16.

Figure 2:
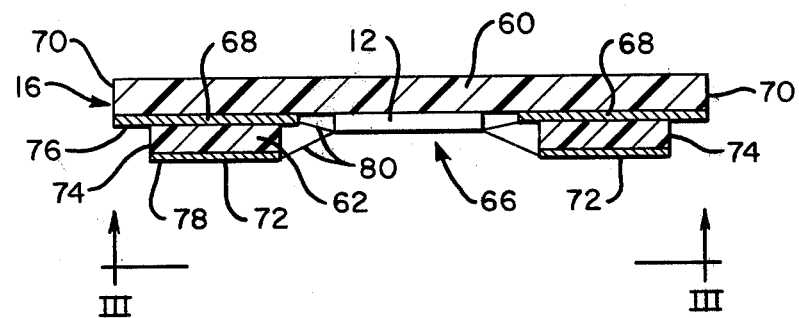
FIG. 2 is a transverse sectional view of the leadless integrated circuit package in the assembly of FIG. 1, taken along the line II—II of FIG. 1.
Figure 3:
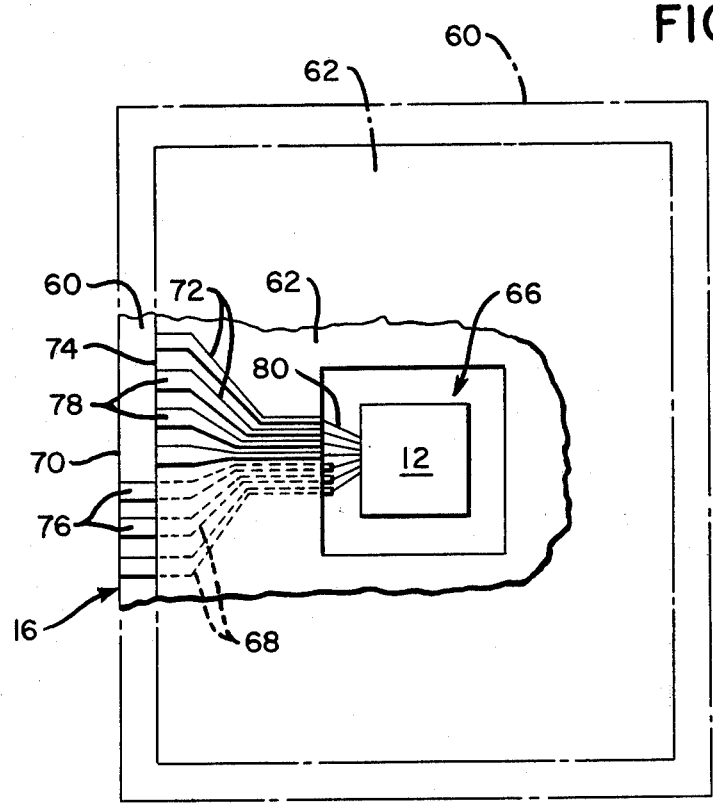
FIG. 3 is a fragmentary bottom view of the leadless integrated circuit package of FIG. 2, as seen along the line III—III of FIG. 2.

Referring now to FIGS. 2 and 3, there is shown in greater detail the leadless integrated circuit package 16. As can be seen, the leadless package 16 is comprised of an upper insulating layer 60 and a lower insulating layer 62. The lower layer 62 is open at its center and defines, with the underside of the top layer 60, a central open portion or pocket 66 for receiving the integrated circuit chip 12. The integrated circuit chip 12 may be fixed, such as by adhesive, to the underside of the top layer 60 at the pocket 66.

A set or plurality of coplanar conductors 68 (illustrated partially in FIG. 3) extend outwardly along the underside of the upper layer 60 from the pocket 66 to contact touching or coupling edges 70 located about the periphery of the upper layer. Likewise, a set or plurality of coplanar conductors 72 (illustrated partially in FIG. 3) extend outwardly along the underside of the lower layer 62 from the pocket 66 to contact touching or coupling edges 74 located about the periphery of the lower layer. The conductors 68 terminate at pads 76 along the contact coupling edges 70 of the upper layer 60 and the conductors 72 terminate at pads 78 along the contact coupling edges 74 of the lower layer 62. The conductors 68 and 72 are electrically connected at the pocket 66 in a conventional fashion, such as by wires 80, to the integrated circuit chip 12.

Although, for purposes of simplifying the drawings, the conductors 68 and 72 are shown in FIG. 3 as extending from generally only one side of the pocket 66 to the contact coupling edges, in actual practice the conductors will extend from each side of the pocket 66 to all four edges along the periphery of each of the layers 60 and 62.

The conductors 68 and the conductors 72 lie in planes that are essentially separated by the thickness of the lower insulating layer 62. As will become apparent, the separation of the conductors 68 and the conductors 72 in a direction which is generally perpendicular or transverse to the direction in which the conductors extend outwardly permits an increase in the number of external connections to the integrated circuit chip 12, without a significant increase in the surface area of the leadless package 16.

As can be seen in FIGS. 2 and 3, the upper layer 60 is larger in surface area than the lower layer 62 so that the contact coupling edges 70 of the layer 60 extend beyond and are spaced outwardly from the contact coupling edge 74 of the layer 62. The pads 76 of conductors 68 are exposed at the edges 70 so that they each couple with or touch one of the previously mentioned contacts 40 in the connector receptacle 20. The pads 78 of the conductors 72 are spaced inwardly, as well as downwardly from the pads 76, so that they each couple with or touch one of the previously mentioned contacts 42 in the receptacle 20.

The conductors 68 and 72 can be formed on the layers 60 and 62 using a conventional process, such as photoetching. Once the conductors 68 and 72 have been so formed, the layer 62 can be affixed to the layer 60 by, for example, a suitable adhesive or the like.

Figure 4:
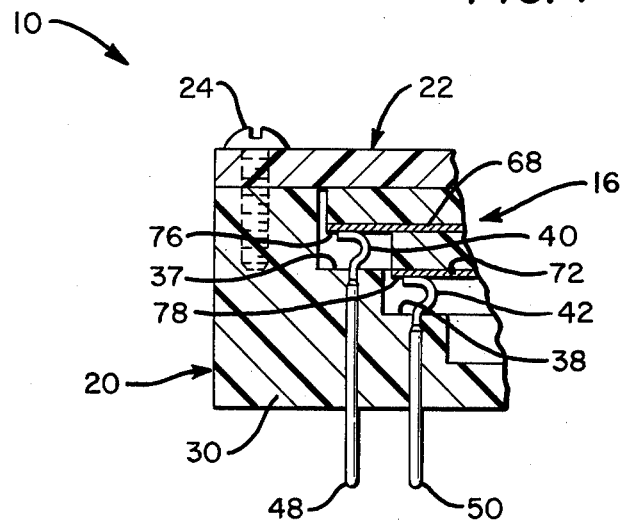
FIG. 4 is an enlarged fragmentary sectional view of the connector assembly of FIG. 1.

As illustrated in FIG. 4, when the leadless package 16 is secured in the connector receptacle 20, with the screws 24 holding the cover plate 22 firmly at the top of housing 30 of connector receptacle 20, the leadless package 16 is urged against the contacts 40 and 42 along the ledges 37 and 38 on the side walls of housing 30. The contacts 40 and 42 will resiliently deform as needed to accommodate the package 16, with each contact in firm physical and electrical contact with one of the pads 76 and 78 on the package 16. An electrical path is thereby established between each of the pins 48 and 50 and the circuitry on the integrated circuit chip 12.

It should be apparent from the foregoing description that the number of external electrical connections made to the integrated circuit chip 12 in the leadless package 16 is significantly greater than the number of external electrical connections in prior leadless packages by virtue of having both the plurality of conductors 68 and the plurality of conductors 72, each plurality of conductors extending outwardly from integrated circuit chip 12 so that each conductor makes electrical contact with one of the contacts 40 and 42 in the connector receptacle 20. Since the conductors 68 on layer 60 lie in a plane that is spaced transversely from the plane in which conductors 72 on layer 62 lie, the amount of surface area that the leadless package 16 occupies is not significantly greater than the surface are of prior packages that have only one plurality or set of conductors.

Figure 5:
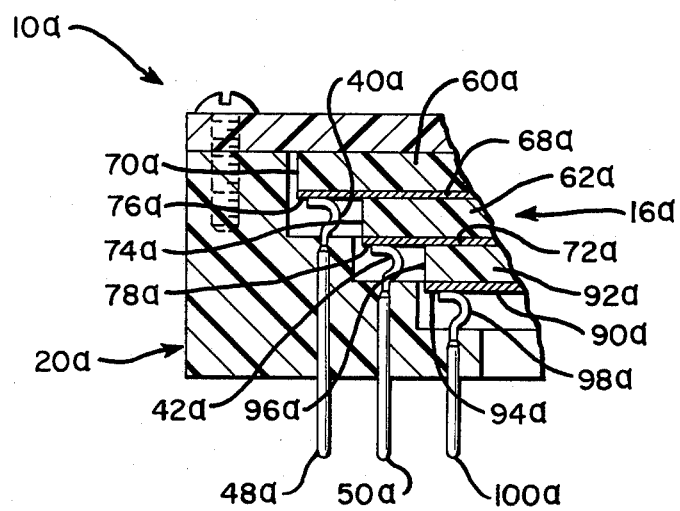
FIG. 5 is an enlarged fragmentary sectional view of a connector assembly, illustrating an alternative embodiment of the present invention.

In FIG. 5, there is shown a connector assembly 10a illustrating an alternative embodiment of the present invention. In order to further increase the number of electrical connections made to an integrated circuit chip (not shown) that is mounted in a leadless integrated circuit package 16a, the package 16a of the connector assembly 10a is shown as having a set of coplanar conductors 68a, a set of coplanar conductors 72a, and a set of coplanar conductors 90a. The conductors 68a each are formed on the underside of an upper insulating layer 60a, each extend outwardly from the center of layer 60a, and each terminate at a pad 76a at a contact coupling edge 70a of the layer 60a. The conductors 72a each are formed on the underside of a middle insulating layer 62a, each extend outwardly from the center of layer 62a, and each terminate at a pad 78a at a contact coupling edge 74a of the layer 62a. In the same fashion, conductors 90a are each formed on the underside of a lower insulating layer 92a, each extend outwardly from the center of layer 92a, and each terminate at a pad 94a at a contact coupling edge 96a of the layer 92a.

The contact coupling edge 96a on layer 92a is spaced inwardly and downwardly of contact coupling edge 74a and layer 62a. Likewise, contact coupling edge 74a on layer 62a is spaced downwardly and inwardly of contact coupling edge 70a on layer 60a. As a result, when the leadless package 16a is secured in a connector receptacle 20a, the pads 76a, 78a and 94a make firm physical and electrical contact with contacts 40a, 42a and 98a within the receptacle 20a. The contacts 40a, 42a and 98a are electrically connected to pins 48a, 50a and 100a, respectively, that project from the bottom of the receptacle 20a.

It should be apparent, of course, that although the embodiment of FIG. 5 shows three sets of coplanar conductors extending outwardly from the integrated circuit chip at the center of the leadless package 16a, additional sets of conductors and insulating layers could be provided to even further increase the number of external electrical connections to the integrated circuit chip.

Although the presently preferred embodiments of the present invention have been described, it will be understood that within the purview of this invention various changes may be made within the scope of the appended claims.

I claim:

1. A leadless integrated circuit package for supporting an integrated circuit chip, comprising:
   first and second insulating layers, said first and second layers in overlying relation and each having a contact coupling outer edge, with the contact coupling outer edge of one of said first and second layers projecting beyond the contact coupling outer edge of the other of said first and second layers; and
   a plurality of conductors associated with each of said first and second layers, each of said conductors extending from said chip at the center of its associated layer to said contact coupling outer edge of its associated layer.

2. A leadless integrated circuit package for supporting an integrated circuit chip and for being mounted in an electrical connector receptacle having a plurality of contacts, said package comprising:
   first and second insulating layers, said first and second layers in overlying relation, with at least one of the outer edges of said first layer projecting out from an adjacent one of the outer edges of said second layer; and
   at least one conductor disposed on each of said first and second layers, said conductor of said first layer extending from said chip to the projecting outer edge of said first layer and said conductor of said second layer extending from said chip to the adjacent outer edge of said second layer so that, when said package is mounted in said receptacle, one of said contacts is coupled with said conductor of said first layer at the projecting outer edge and another of said contacts is coupled with said conductor of said second layer at the adjacent outer edge.

3. In a leadless circuit package of the type having an insulating layer with conductors terminating along at least one outer edge of said insulating layer for being coupled with contacts in an electrical connector receptacle, the improvement comprising:
   a second insulating layer, said first-mentioned insulating layer in overlying relation with said second insulating layer, said second insulating layer having conductors terminating at an outer edge adjacent and spaced inwardly of said one outer edge of said first-mentioned insulating layer, so that said contacts in said electrical connector receptacle may be coupled with said conductors at said one outer edge of said first-mentioned insulating layer and said adjacent outer edge of said second insulating layer.

4. An assembly for providing electrical connections between an integrated circuit chip and a computer backpanel or the like, comprising:
   a leadless integrated circuit package for supporting said integrated circuit chip, said package including:
   first and second insulating having contact coupling edges, with a contact coupling edge of one of said first and second insulating layers spaced inwardly from a contact coupling edge of the other of said first and second insulating layers; and
   conductors on each of said first and second insulating layers extending between the contact coupling edge of each of said first and second insulating layers and the integrated circuit chip, with said conductors exposed at the contact coupling edges; and
   an electrical connector receptacle for receiving said leadless integrated circuit package, said receptacle including:
   a plurality of electrical pins for making electrical connections at the backpanel; and
   a contact connected to each of said pins, each of said contacts positioned so that one of said contacts is coupled with each of said conductors at the contact coupling edge of said first insulating layer and one of said contacts is coupled with each of said conductors at the contact coupling edge of said second insulating layer.

5. A connector receptacle for receiving a leadless integrated circuit package, comprising:
   a housing forming an outwardly opening chamber for receiving the package;
   a first, upper ledge formed within the chamber on the side walls of said housing;
   a second, lower ledge formed within the chamber on the side walls of said housing;
   first and second rows of contacts located within the chamber for making contact with conductors on the package, said first row of contacts spaced along said first ledge and said second row of contacts spaced along said second ledge; and
   electrical pins projecting through said housing, each of said pins electrically connected to one of the contacts in said first and second rows of contacts.

6. In a method of producing a leadless integrated circuit package, the package of the type mounting an integrated circuit chip and having an insulating layer and a plurality of conductors formed on the insulating layer and extending from the integrated circuit chip outwardly to the periphery of the insulating layer, a method for increasing the number of external electrical connections to the integrated circuit chip without substantially increasing the surface area of the package, the method comprising:
   providing a second insulating layer underlying the first-mentioned insulating layer, with the periphery of the second insulating layer being spaced inwardly of the periphery of the first-mentioned insulating layer; and
   forming a second plurality of conductors on the second insulating layer, the second conductors extending from the integrated circuit chip outwardly to the periphery of the second insulating layer.

7. An integrated circuit package for supporting an integrated circuit chip, comprising:
   a first insulating layer;
   a second insulating layer;
   said first and second layers in overlying relation and each having an outer edge, with said outer edge of said first layer projecting beyond said outer edge of said second layer; and
   a plurality of conductors associated with and disposed on each of said first and second layers, each of said conductors extending from the center of its associated layer to said outer edge of its associated layer, so that said conductors are exposed on said first layer at its outer edge as well as on said second layer at its outer edge for being electrically connected to contacts at said outer edge of said first and second layers.

8. The circuit package of claim 7, wherein said outer edge is located about the periphery of its associated layer.

9. The circuit package of claim 8, wherein said second layer is open at its center and defines a pocket with said first layer, with the integrated circuit chip affixed to said first layer at said pocket.

* * * * *